US006239625B1

United States Patent
Abe

(10) Patent No.: US 6,239,625 B1
(45) Date of Patent: May 29, 2001

(54) DETECTION CIRCUIT

(75) Inventor: Masayoshi Abe, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/376,433

(22) Filed: Aug. 18, 1999

(30) Foreign Application Priority Data

Aug. 20, 1998 (JP) .............................................. P10-234474

(51) Int. Cl.$^7$ .................................................. G01K 19/00
(52) U.S. Cl. .................................................. 327/58; 327/13
(58) Field of Search .............................. 327/58, 13, 62; 330/302; 333/32

(56) References Cited

U.S. PATENT DOCUMENTS

| | | | |
|---|---|---|---|
| 3,061,790 | 10/1962 | Theriault | 329/349 |
| 4,639,623 | 1/1987 | Pullen, Jr. | 327/50 |
| 4,851,719 | * 7/1989 | Hitomi | 327/58 |
| 4,859,965 | 8/1989 | Paolella et al. | 330/289 |
| 5,003,196 | * 3/1991 | Kawaguchi | 327/62 |
| 5,789,983 | * 8/1998 | Fujita | 330/277 |

FOREIGN PATENT DOCUMENTS 0 851 572 A1    7/1998  (EP) .

* cited by examiner

Primary Examiner—Toan Tran
Assistant Examiner—Linh Nguyen
(74) Attorney, Agent, or Firm—Ronald P. Kananen; Rader, Fishman & Grauer

(57) ABSTRACT

To realize a high frequency power detection circuit constituting a detection circuit by a GaAs semiconductor and thereby capable of realizing a small sized, low cost, and broad band detection circuit and suppressing variations in the detection characteristics due to variations in a pinchoff voltage of the field effect transistors, the invention is a detection circuit for detecting an envelope of a high frequency signal, comprising a field effect transistor to the gate of which the high frequency signal is input, a gate bias circuit for providing a gate bias voltage to the gate of the field effect transistor, a capacitor connected between the drain of the field effect transistor and the ground, and a load capacitor and a load resistor connected in parallel between the source of the field effect transistor and the ground, wherein a detection signal corresponding to the envelope of the high frequency input signal is output from the source of the field effect transistor. Various gate biasing circuits are ultimately disclosed.

20 Claims, 11 Drawing Sheets

DETECTION CIRCUIT

BACKGROUND OF THE INVENTION

1. Field of the Invention

The present invention relates to a detection circuit for envelope-detecting of a high frequency signal used in a communications device sending and receiving high frequency signals and a measuring device measuring signal levels of high frequency signals.

2. Description of the Related Art

An example of the configuration of a conventional high frequency detection circuit is shown in FIG. 12. As illustrated, the detection circuit is constituted by a diode D1, a capacitor C1, a resistor R1 and a direct current (DC) bias circuit formed by a fixed voltage source VD.

The diode D1 is used as an active element. The anode of the diode D1 is connected to an input terminal RFin of high frequency signals, while the cathode is connected to the output terminal of the detection circuit. Furthermore, the DC bias circuit providing a DC bias voltage Vd is connected to the anode of the diode D1 through the resistor R1, while the capacitor C1 for eliminating the high frequency component is connected to the cathode of the diode D1. Note that, as illustrated, a load resistance $R_L$ is connected to the output terminal of the detection circuit.

A high frequency signal is input to the input terminal RFin. By the rectifying effect of the diode D1 and the capacitor C1 with a sufficiently large capacitance, a voltage signal in accordance with the envelope of the input high frequency signal is output as a detection output signal Vout.

In the high frequency power detection circuit, it is required that a linear detection output signal Vout can be obtained from as low a signal level as possible to as high a signal level as possible, that is, in a wide dynamic range.

FIG. 13 shows an example of a detection characteristic of a high frequency power detection circuit using a high frequency diode as an active element. In this example, a silicon Schottky barrier diode is used and the DC bias voltage Vd of the diode D1 in FIG. 12 is set to 0V (zero bias). The graph depicts a relation between the input high frequency power Pin and the output voltage Vout obtained when the frequency of the high frequency signal is 10 GHz.

A silicon Schottky diode has mainly been used for high frequency power detection circuits because of its small turn-on voltage. Since the threshold voltage is small, the minimum detectable level of the input power becomes low.

By supplying a DC bias voltage Vd to the diode (that is, non-zero bias), it is possible to make the minimum detectable level of input power smaller, however, at the same time, the minimum detectable level of the input power rises, the current consumption increases, and the noise increases since the DC offset voltage rises.

A detection circuit using a silicon Schottky diode has a so-called hybrid configuration. Namely, diodes are mounted on a dielectric substrate such as a ceramic substrate, while passive elements such as resistors and capacitors are soldered to the dielectric substrate or formed on the dielectric substrate. The diodes and other devices are connected by wire bonding and the like.

In the conventional detection circuit using a silicon diode described above, however, since hybrid technology is used, the operational frequency band width is limited by influence of the parasitic inductance of the wire bonding. Further, since there are a large number of the manufacturing steps, problems such as a rise in the manufacturing costs and an increase of fluctuation in manufacture are caused. One means to solve these problems is monolithication. However, a silicon diode is not suited for monolithication. Further, in a radio communications device where there are strict requirements for miniaturization of the components, integrated circuits are being increasingly used in the high frequency circuit portions as well. Since the integration of the detection circuit using a silicon diode with other high frequency circuits is difficult, at the present time high frequency devices with signal frequencies higher than 1 GHz mostly use gallium arsenide (GaAs) semiconductors.

The problems mentioned above can be solved by using GaAs diodes. However, the threshold voltage of a GaAs diode is higher than that of a silicon diode. For this reason, the minimum detectable level of input power is large in a high frequency power detection circuit using a GaAs diode. In this way, a GaAs diode is better than a silicon diode in the point of monolithication, but is inferior in terms of the detection performance.

One means to improve the detection performance is to make the current-voltage characteristic (IV characteristic) of the diode more linear. However, the IV characteristic of a diode becomes a logarithmic function of the voltage between the anode and cathode of the diode regardless of the type of the diode and the semiconductor material. Accordingly, it is theoretically difficult to make the IV characteristic of the diode close to linear.

The present invention was made in consideration with such a circumstance and has as an object thereof to provide a high frequency power detection circuit constituting a monolithic high frequency power detection circuit by a GaAs semiconductor and thereby capable of realizing a small sized, low cost, and broad band detection circuit, capable of suppressing variations in the detection characteristics due to variations in a pinchoff voltage of the field effect transistors, and capable of obtaining a high detection output voltage at a low power of a high frequency signal.

SUMMARY OF THE INVENTION

To obtain the above object, the detection circuit of the present invention is a detection circuit for detecting an envelope of a high frequency signal, comprising a field effect transistor to the gate of which the high frequency signal is input, a gate bias circuit for providing a gate bias voltage to the gate of the field effect transistor, a capacitor connected between the drain of the field effect transistor and the ground, and a load capacitor and a load resistor connected in parallel between the source of the field effect transistor and the ground, wherein a detection signal corresponding to the envelope of the high frequency input signal is output from the source of the field effect transistor.

Further, in the present invention, preferably, the field effect transistor is a gallium-arsenide field effect transistor; the gate bias circuit comprises a first resistor connected to a power supply and a second resistor connected between the first resistor and the ground and a divided voltage between the first and the second resistor is input to the gate of the field effect transistor as the gate bias voltage; and any one of the first or the second resistor is a variable resistor, and the resistance of the variable resistor is controlled so that a gate bias voltage optimizing the detection performance of the field effect transistor is generated.

Alternatively, in the present invention, preferably the gate bias circuit comprises a gate bias voltage generating circuit for generating a gate bias voltage optimizing the detection performance of the field effect transistor based on the detection signal from the source of the field effect transistor and the gate bias voltage of the field effect transistor; and the gate bias voltage generating circuit comprises an analog-to-digital converter for converting the detection signal from the source of the field effect transistor to a digital signal, a processing circuit for calculating a gate bias voltage optimizing the detection performance of the field effect transistor based on the output signal of the analog-to-digital converter and the gate bias voltage of the field effect transistor, and a digital-to-analog tea converter for converting a digital signal indicating the result of the processing circuit to an analog signal.

Further, in the present invention, preferably, further provision is made of an impedance matching circuit for matching an output impedance of a signal source generating the high frequency input signal and a gate input impedance of the field effect transistor at a gate of the field effect transistor.

According to the present invention, a field effect transistor (FET) formed by a GaAs semiconductor is used as an active element for constituting the high frequency power detection circuit. The gate and the drain of the field effect transistor are biased to predetermined potentials by the gate bias circuit and the drain bias circuit, respectively. A parallel circuit of the capacitor and the resistor is connected between the source of the field effect transistor and the ground. A high frequency signal is input to the gate of the field effect transistor through, for example, a coupling capacitor and an envelope signal of the high frequency signal is output from the source of the field effect transistor as a detection signal.

For suppressing variations in the detection performance of a field effect transistor due to variations in the pinchoff voltage of the field effect transistor, the gate bias circuit is constituted by a resistor and a variable resistor connected in series between a fixed voltage source and the ground. By controlling the resistance value of the variable resistor, the level of the divided voltage is controlled and the detection performance of a field effect transistor is kept optimum.

Further, a gate bias voltage generating circuit comprised of an analog-to-digital converter, a processing circuit such as a CPU, and a digital-to-analog converter is provided to convert the detection signal to a digital signal, calculate an optimum value of the gate bias voltage optimizing the detection performance of the field effect transistor, then convert the data showing the optimum value of the gate bias voltage to an analog signal and input it to the gate of the field effect transistor. As a result, an optimum value of the gate bias voltage optimizing the detection performance of the field effect transistor is controlled automatically and a stabilized detection characteristic can be realized.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
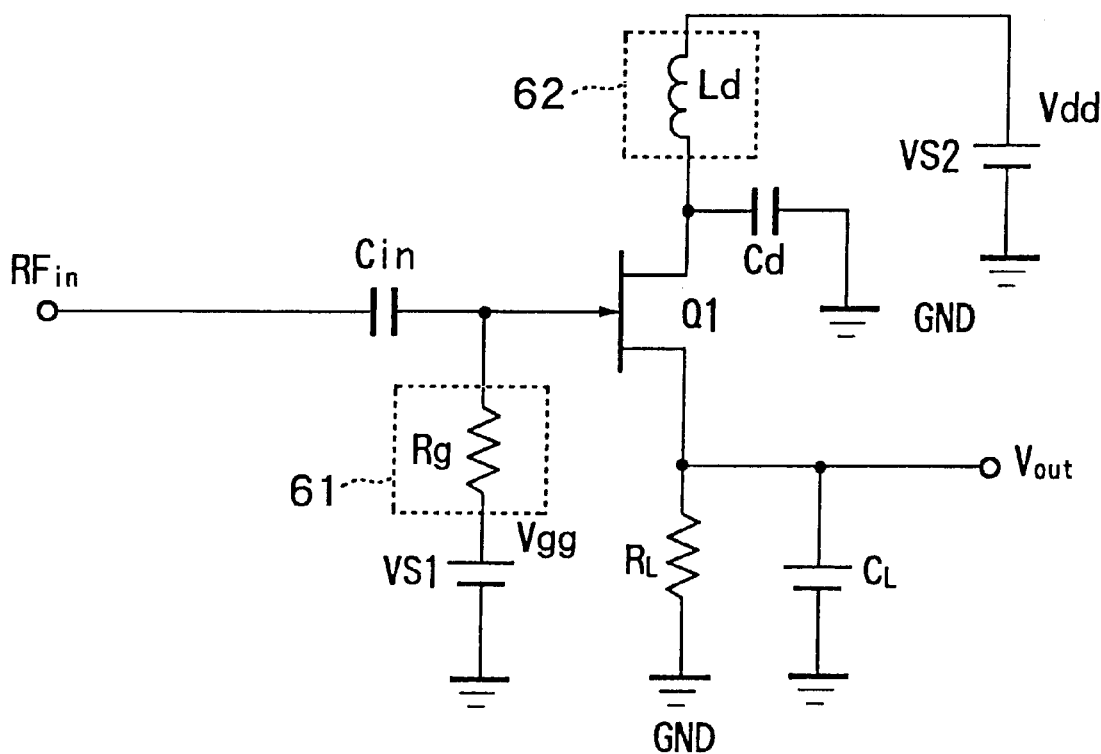
FIG. 1 is a circuit diagram of a first embodiment of the detection circuit according to the present invention.

FIG. 1 is a circuit diagram of a first embodiment of a high frequency power detection circuit according to the present invention.

In the high frequency power detection circuit of the present embodiment, a field effect transistor (FET) is used as an active element.

As illustrated, the gate of the field effect transistor (below, simply referred to as a transistor for convenience) Q1 is connected to the input terminal RFin through a DC cutting capacitor Cin. A gate bias circuit 61 providing a gate bias voltage is connected to the gate of the transistor Q1, while a voltage source VS1 providing a DC voltage Vgg is connected to the gate bias circuit 61. Further, a drain bias circuit 62 providing a drain bias voltage is connected to the drain of the transistor Q1, while a voltage source VS2 providing a DC voltage Vdd is connected to the drain bias circuit 62.

A coupling capacitor Cd having a sufficiently large value of capacitance is connected between the drain of the transistor Q1 and the ground GND. Between the source of the transistor Q1 and the ground GND, a resistor $R_L$ and a capacitor $C_L$ having a sufficient large capacitance value are connected in parallel. A voltage difference Vout between the source of the transistor Q1 and the ground GND is a detection output signal.

Note that, in the high frequency power detection circuit shown in FIG. 1, the gate bias circuit 61 is constituted by a single resistor Rg, but the invention is not restricted to this. An object of the gate bias circuit 61 is the isolation between the gate terminal of the transistor Q1 and the voltage source VS1 at the frequency of the input signal, so the gate bias circuit can also be constituted by a choke coil (an inductor having a sufficiently large inductance), a combination of a choke coil and a shunted capacitor, a distributed constant circuit, and so forth.

Further, the same applies to the drain bias circuit 62 as in the case of the gate bias circuit 61. An object of the drain bias circuit 62 is the isolation between the drain of the transistor Q1 and the voltage source VS2 at the frequency of the input signal. Instead of the illustrated inductor Ld, a inductor Ld and a shunted capacitor $C_L$ can also be used. Further, in the case when the capacitor $C_L$ has a sufficiently large capacitance, the inductor Ld can be omitted.

Figure 2A:
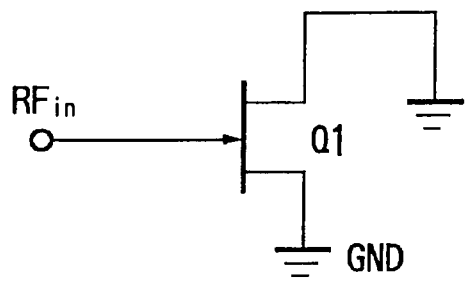
FIGS. 2A and 2B are circuit diagrams of an equivalent high frequency signal circuit of the detection circuit of the first embodiment.
Figure 2B:
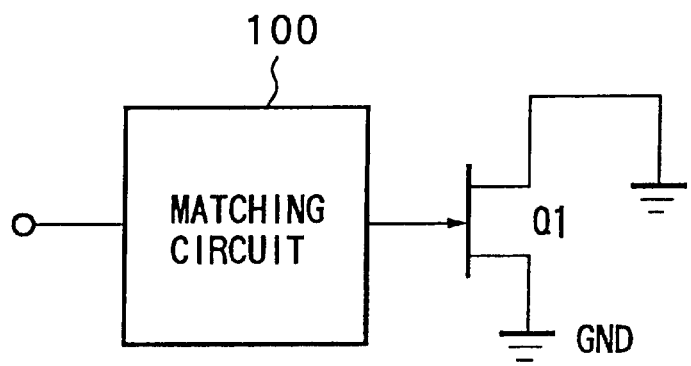

FIGS. 2A and 2B show alternating current (AC) equivalent circuits of the high frequency power detection circuit of the present embodiment.

In the high frequency power detection circuit shown in FIG. 1, when the capacitance of the DC cutting capacitor Cin between the input terminal RFin of the high frequency signal and the gate of the transistor Q1 is sufficiently large and the capacitances of the coupling capacitor $C_L$ connected to the source of the transistor Q1 and the coupling capacitor Cd connected to the drain are sufficiently large, since the impedances of these capacitors are small and can be substantially ignored in an alternating signal of a high frequency, as shown equivalently in FIG. 2A, for an AC signal of high frequency, the gate of the transistor Q1 of the detection circuit of the present embodiment is connected to the input terminal RFin of the high frequency signal and the source and the drain are grounded. That is, in the high frequency band, the drain and the source of the transistor Q1 are at the same potential and operate as a diode.

FIG. 2B shows an equivalent circuit with a matching circuit (matching network) 100 connected between the input terminal RFin of the high frequency signal and the gate of the transistor Q1. By connecting the matching circuit 100 between the high frequency signal input terminal RFin and the gate of the transistor Q1, the minimum detectable input power Pmin of the detection circuit becomes smaller. Namely, the sensitivity of the high frequency power detection circuit can be improved.

Figure 3:
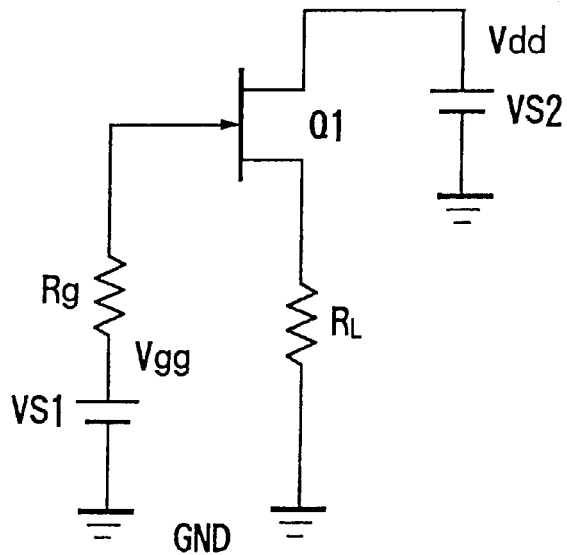
FIG. 3 is a circuit diagram of a direct current equivalent circuit of the detection circuit of the first embodiment.

FIG. 3 shows a DC equivalent circuit of the high frequency power detection circuit shown in FIG. 1. As illustrated, in DC operation, the gate of the transistor Q1 is connected to the voltage source VS1 through the resistor Rg and is biased to the DC gate bias voltage Vgg provided by the voltage source VS1. The drain of the transistor Q1 is connected to the voltage source VS2 and is biased to the DC drain bias voltage Vdd. The source of the transistor Q1 is connected to ground through the load resistor $R_L$.

Figure 4C:
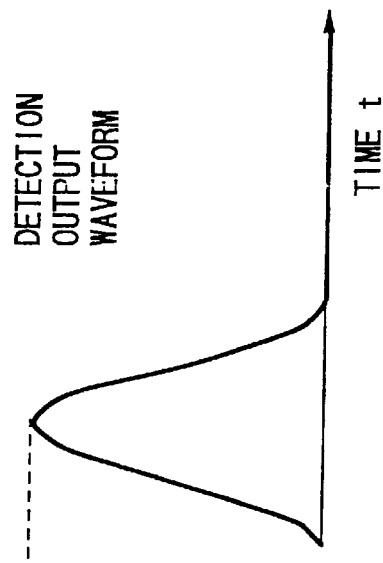
FIGS. 4A to 4C are graphs explaining the principle of the detection circuit of the first embodiment.
Figure 4A:
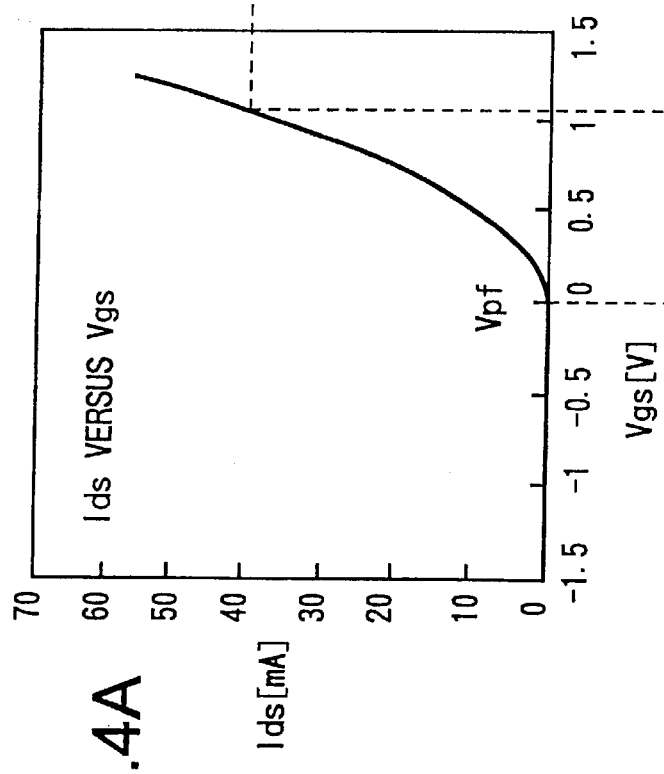
Figure 4B:
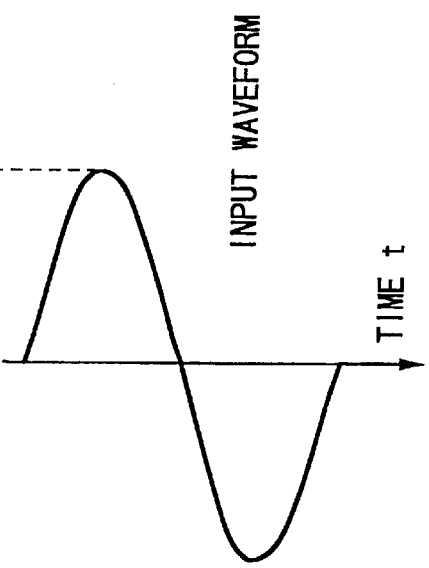

FIGS. 4A to 4C show the principle of operation of the high frequency power detection circuit of the present embodiment. FIG. 4A shows a characteristic of a drain current Ids versus a voltage Vgs between the gate and the source of the FET. As illustrated, when the gate-source voltage Vgs of the FET exceeds the pinchoff voltage Vpf, the current Ids flows to the drain. The drain current Ids Increases along with the increase of the voltage Vgs. On the other hand, when the gate-source voltage Vgs of the FET is lower than the pinchoff voltage Vpf, current Ids does not flow to the drain.

By making use of the characteristic of the FET described above, when inputting an AC signal shown in FIG. 4B to the gate of the FET around the pinchoff voltage Vpf, a detection output signal shown in FIG. 4C is obtained by the rectifying effect of the FET.

Figure 5:
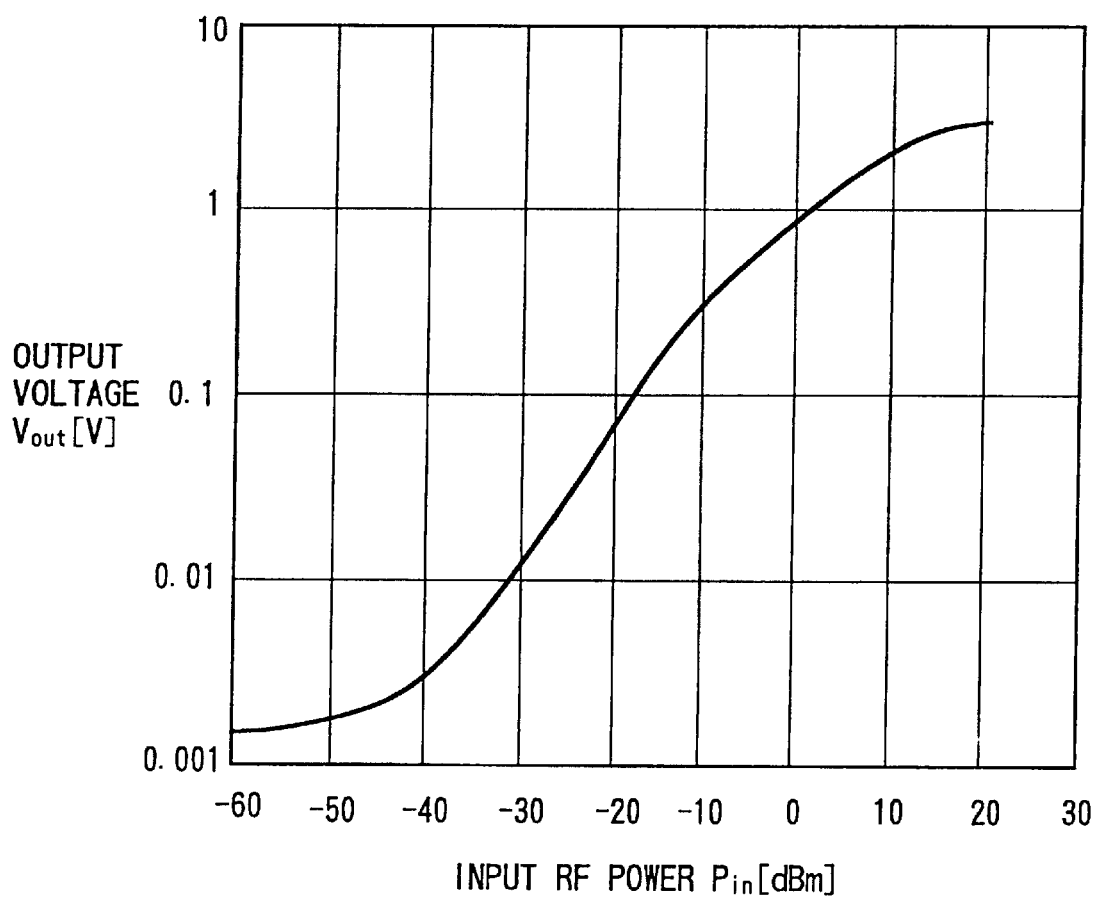
FIG. 5 is a graph indicating the detection characteristic of the detection circuit of the first embodiment.

FIG. 5 shows a relation between an input power Pin of a high frequency signal and a detection output voltage Vout of the high frequency power detection circuit of the present embodiment. Due to the increase of the input power Pin of the high frequency signal, the detection output voltage Vout increases relatively linearly, and an excellent detection characteristic can be obtained. Note that pinchoff voltage Vpf in the characteristic of the current Ids versus the voltage Vgs of the FET varies due to the temperature of the FET, manufacturing variations, and so forth. The variation of the pinchoff voltage Vpf is liable to cause variations in the detection characteristic of the detection circuit and cause the degradation of the detection characteristic.

Figure 6:
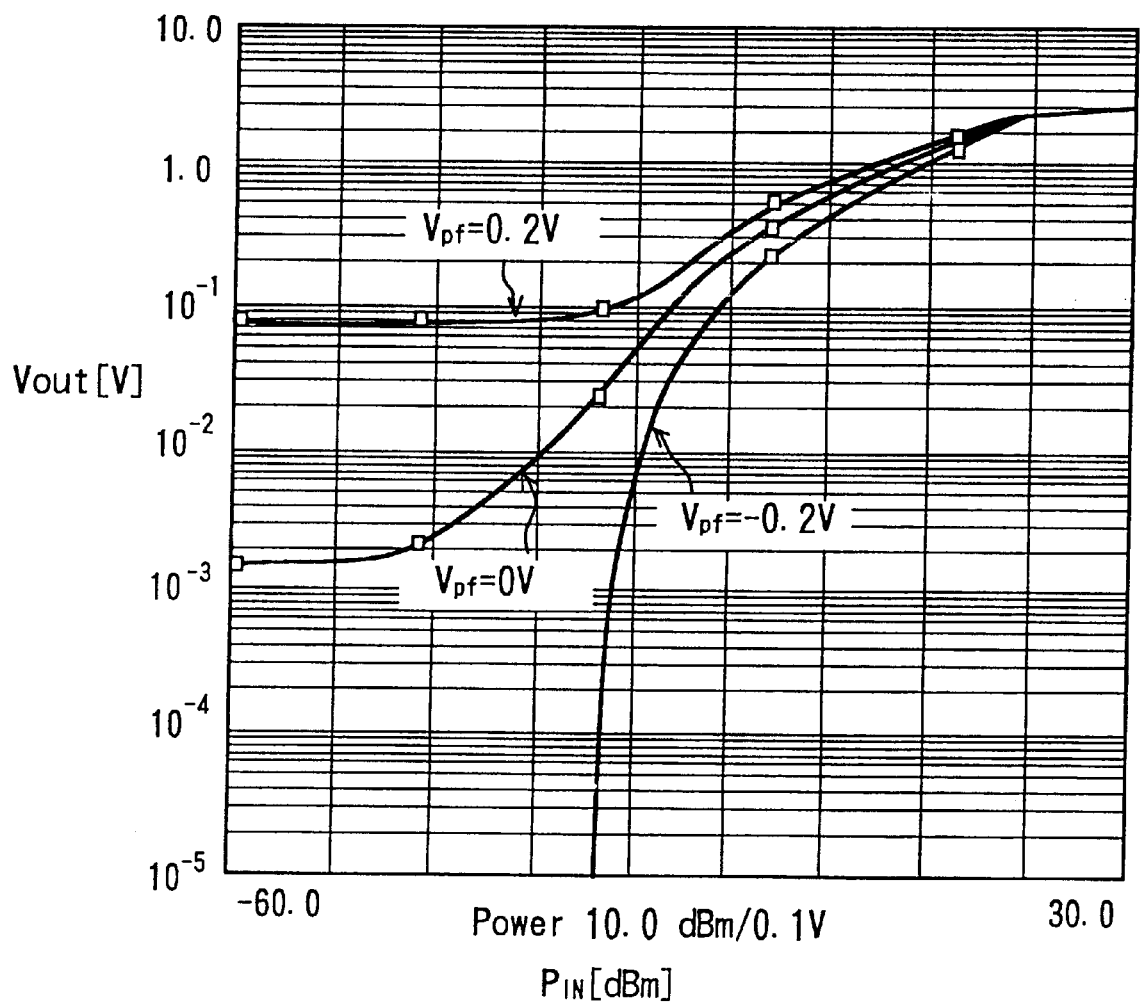
FIG. 6 is a graph showing the effect of the pinchoff voltage Vpf on the detection characteristic.

FIG. 6 shows the variations in the detection characteristic of the present embodiment due to variations in the pinchoff voltage Vpf of the FET. In FIG. 6, the abscissa indicates the input power Pin of the high frequency signal, while the ordinate indicates the output voltage Vout. As illustrated, the detection characteristic fluctuates tremendously with a variation of ±0.2V in the pinchoff voltage Vpf.

By setting the DC gate bias voltage Vgg of the FET to an optimum value for the variation of the pinchoff voltage Vpf, the variation of the detection characteristic of the high frequency power detection circuit constituted by the FET can be suppressed.

Two examples of detection circuits controlling the DC gate bias voltage of the FET in accordance with the variations in the pinchoff voltage to realize a stable detection characteristic with little variation will be explained in following second and third embodiments.

Second Embodiment

Figure 7:
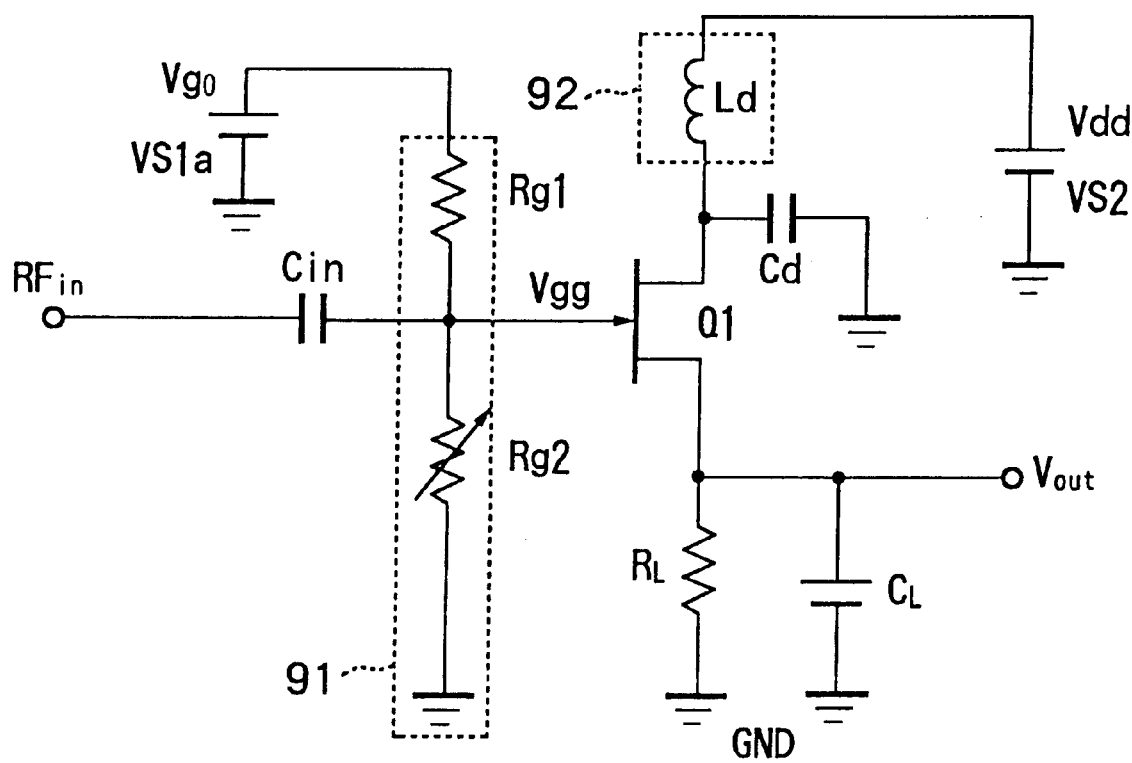
FIG. 7 is a circuit diagram of a second embodiment of the detection circuit according to the present invention.

FIG. 7 is a circuit diagram of a second embodiment of a high frequency power detection circuit according to the present invention.

The detection circuit of the present embodiment is substantially the same in configuration as the detection circuit of the first embodiment shown in FIG. 1 except for a DC bias circuit 91 connected to the gate of the transistor Q1. That is, a drain bias circuit 92 connected to the drain of the transistor Q1, in substantially the same way as the drain bias circuit 62 shown in FIG. 1, is constituted by an inductor Ld having a sufficiently large inductance. Further, instead of the inductor Ld, the inductor Ld and a shunted capacitor Cd can also be used.

In the present embodiment, the gate bias circuit 91 is constituted by a resistor Rg1 and a variable resistor Rg2. In the gate bias circuit 91, the resistor Rg1 and the variable resistor Rg2 are connected in series, and a voltage source VS1a provides a voltage Vg0 to the resistor Rg1. The divided voltage Vgg of the resistor Rg1 and the variable resistor Rg2 is input to the gate of the transistor Q1 as a DC gate bias voltage.

In the present embodiment, since a variable resistor Rg2 is provided in the gate bias circuit 91, the DC gate bias voltage Vgg of the transistor Q1 is controlled by adjusting the resistance of the variable resistor. An optimum detection characteristic can be obtained with respect to a varying pinchoff voltage Vpf by adjusting the resistance of the variable resistor in response to the pinchoff voltage Vpf of the transistor Q1 to control the DC gate bias voltage Vgg.

Note that although the resistor Rg2 was made the variable resistor in the gate bias circuit 91 described above, the resistor Rg1 can also be made the variable resistor. The variable resistor can be comprised by a resistor which can be controlled mechanically or electrically.

As explained above, according to the present embodiment, by using a variable resistor to divide a supplied voltage Vg0 of a voltage source VS1a and to generate a gate bias voltage Vgg, it is possible to control the gate bias voltage Vgg produced in accordance with the variations of the pinchoff voltage Vpf of the transistor Q1, suppress the effect of the variation of the pinchoff voltage, and realize an optimum detection characteristic.

Third Embodiment

Figure 8:
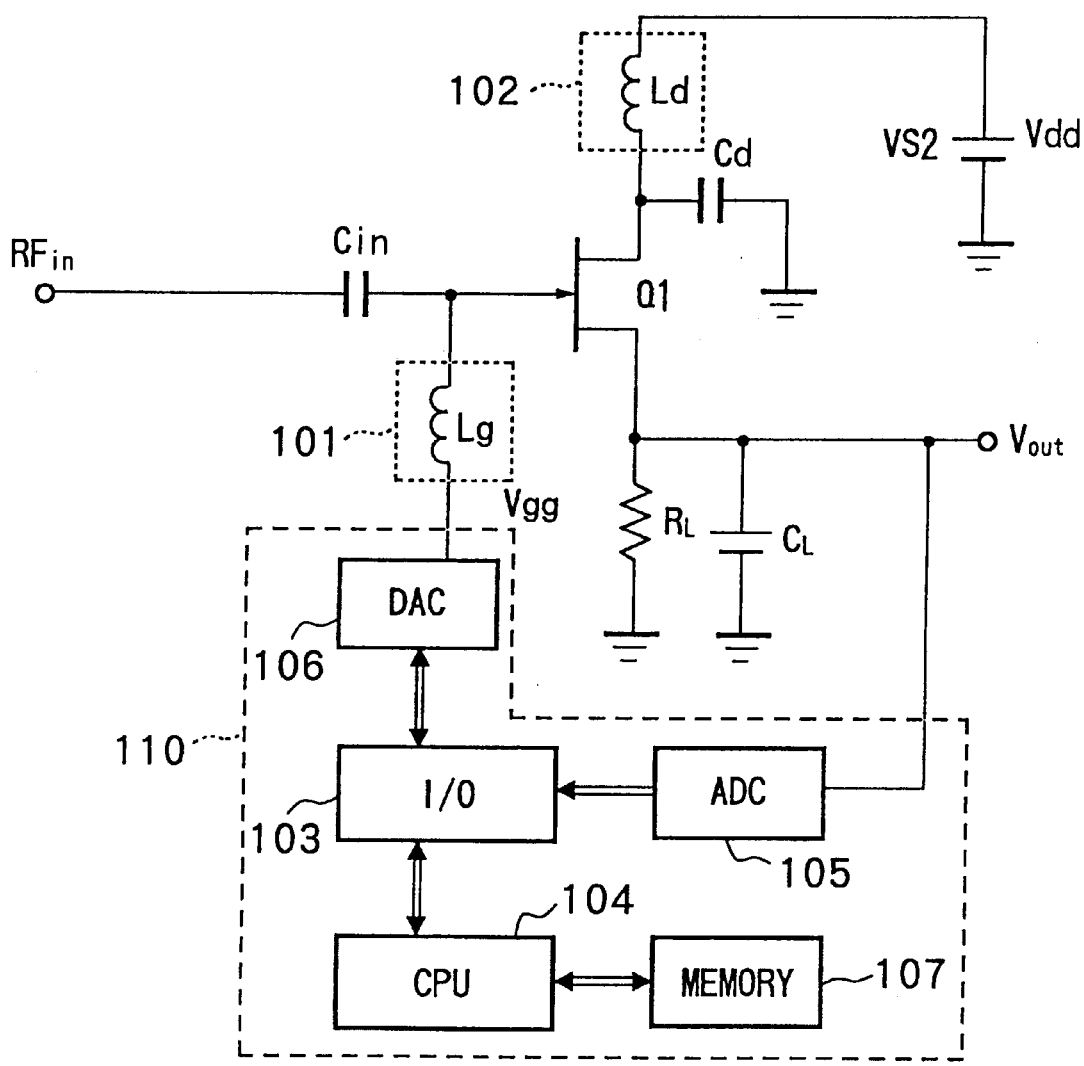
FIG. 8 is a circuit diagram of a third embodiment of the detection circuit according to the present invention.

FIG. 8 is circuit diagram of a third embodiment of a high frequency power detection circuit according to the present invention. As illustrated, in the detection circuit of the present embodiment, a gate bias voltage generating circuit 110 is provided which automatically sets an optimum gate bias voltage Vgg for variations in the pinchoff voltage Vpf of the transistor Q1 and supplies it to a gate bias circuit 101.

Note that the rest of the configuration is substantially the same as those of the first and second embodiments. Below, an explanation will be made of the detection circuit of the present embodiment centering around the configuration and operation of the gate bias voltage generating circuit 110.

As illustrated in FIG. 8, the gate bias circuit 101 is constituted by, for example, an inductor Lg having a large inductance, but the present embodiment is not limited to this. Instead of the inductor Lg, the gate bias circuit can also be constituted by a resistor Rg having a large resistance in the same way as the detection circuit of the first embodiment shown in FIG. 1. Further, it can also be constituted by an inductor and a shunted capacitor or by a distributed constant circuit and so forth.

The gate bias voltage generating circuit 110 is constituted by a CPU 104, input-output interface (I/O) 103, analog-to-digital converter (ADC) 105, digital-to-analog converter (DAC) 106, and memory 107.

The ADC 105 converts the output signal Vout of the detection circuit to a digital signal, then inputs the digital signal to the CPU 104 through the I/O 103.

The CPU 104 judges the detection characteristic of the detection circuit in accordance with the digital signal input from the I/O 103 by referring to data stored in the memory 107, calculates the necessary data for generation of the gate bias voltage of the transistor Q1 to obtain an optimum detection characteristic, then outputs the data to the DAC 106 through the I/O 103.

The DAC 106 receives the data input from the I/O 103 and converts the data to an analog signal Vgg. It then supplies the analog signal Vgg obtained by the conversion to the gate bias circuit 101 as a gate bias voltage.

The gate bias circuit 101 supplies the gate bias voltage Vgg input from the gate bias voltage generating circuit 110 to the gate of the transistor Q1.

In the detection circuit constituted in this way, since a gate bias voltage Vgg giving the optimum detection characteristic is automatically set in accordance with variations in the pinchoff voltage Vpf of the transistor Q1 and supplied to the gate of the transistor Q1, an excellent detection characteristic can be obtained in spite of variations in the pinchoff voltage Vpf of the transistor Q1.

Figure 9:
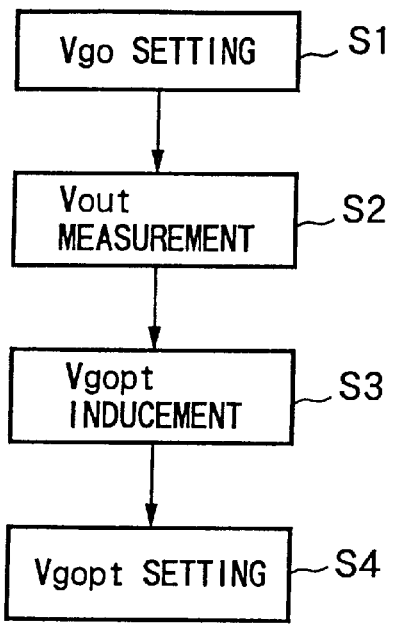
FIG. 9 is a flow chart showing the control process of the bias voltage in the third embodiment.

FIG. 9 is a flow chart of the operation of the gate bias voltage generating circuit in the detection circuit of the present embodiment. Below, an explanation will be made of the control of the gate bias voltage in the present embodiment by referring to FIG. 8 and FIG. 9.

First, the CPU 104 outputs predetermined data to the DAC 106 through the I/O 103. The DAC 106 converts the data input to an analog signal, then supplies the obtained voltage signal to the gate bias circuit 101 as an initial value Vg0 of the gate bias voltage (step S1).

In the state where the initial value Vg0 of the gate bias voltage is supplied to the gate of the transistor Q1, the detection circuit detects the high frequency signal input to the input terminal Rfin and an output voltage signal Vout indicating the envelope of the input signal is output. Analog-to-digital conversion is carried out by the ADC 105, and a digital signal corresponding to the voltage Vout, namely, the result of the detection, is output to the CPU 104 through the I/O 103 (step S2).

The CPU 104 calculates the gate bias voltage required for obtaining the optimum detection characteristic according to the output data for setting the initial value Vg0 of the gate bias voltage and the data obtained from the conversion of the detection output signal Vout and further by referring to other data stored in the memory 107 (step S3). This may be calculated by the method of using a relation of the initial value Vg0 and the optimum value Vgopt or the method of providing the memory 107 with a table indicating the correspondence between the detection output Vout and the optimum value Vgopt of the gate bias voltage.

The CPU 104 generates a digital signal for generating the optimum value Vgopt of the gate bias voltage and outputs this to the DAC 106 through the I/O 103.

The DAC 106 converts the digital signal output from the CPU 104 to an analog signal, then supplies the obtained voltage signal to the gate bias circuit 101 as the optimum value Vgopt of the gate bias voltage (step S4). Since the optimum value Vgopt of the gate bias voltage is supplied to the gate of the transistor Q1 by the gate bias circuit 101, the detection circuit detects the input high frequency signal in the optimum operating state.

The operational control of the gate bias voltage generating circuit 110 is not limited to the process described above. As another adjustment process, it is also possible to input a high frequency reference signal Sref having a known power to the detection circuit, detect a detection output signal Vout in accordance with it, and find the optimum gate bias voltage Vgopt in accordance with it.

In this case, first a high frequency reference signal Sref having a known power is input to the input terminal RFin of the detection circuit. An output signal Vout in accordance with is output at the output terminal of the detection circuit. After that, the detection output signal Vout is converted to a digital signal by the ADC 105 and the obtained data is output to the CPU 104 through the I/O 103.

The CPU 104 finds an optimum value Vgopt of the gate bias voltage for giving an optimum detection characteristic to the detection circuit by referring to the known power Pin of the high frequency reference signal Sref and the detection output signal Vout obtained in accordance with it. The data for realizing the optimum value Vgopt of the gate bias voltage is calculated and is output to the DAC 106 through the I/O 103. By the DAC 106, the input data is converted to an analog signal, and the optimum value Vgopt of the gate bias voltage is output. By the gate bias circuit 101, the optimum value Vgopt of the gate bias voltage output from the gate bias voltage generating circuit 110 is supplied to the gate of the transistor Q1.

As explained above, according to the present invention, a gate bias voltage generating circuit 110 supplying a bias voltage to the gate bias circuit 101 is provided. In the gate bias voltage generating circuit 110, the CPU 104 outputs data based on the initial value of the gate bias voltage to the DAC 106 through the I/O 103. The DAC 106 converts the data from the CPU 104 to an analog signal and supplies it to the gate bias circuit 101. The ADC 105 converts the output signal Vout of the detection circuit to a digital signal and inputs it to the CPU 104 through the I/O 103. The CPU 104 calculates data corresponding to the optimum value of the gate bias voltage for obtaining the optimum detection characteristic based on the initial value of the gate bias voltage and the converted data of the detection result input from the ADC 105 and outputs the data to the DAC 106 through the I/O 103. The DAC 106 converts the data to an analog signal and supplies it to the gate of the transistor Q1 constituting the detection circuit through the gate bias circuit 101.

As a result, since the optimum gate bias voltage Vgopt is generated automatically by the gate bias voltage generating circuit 110 according to variations in the detection characteristic caused by variations in the pinchoff voltage of the transistor Q1 constituting the detection circuit etc. and is supplied to the gate of the transistor Q1 through the gate bias circuit 101, the gate bias voltage is controlled automatically so as to obtain the optimum detection characteristic at all times.

Fourth Embodiment

Figure 10:
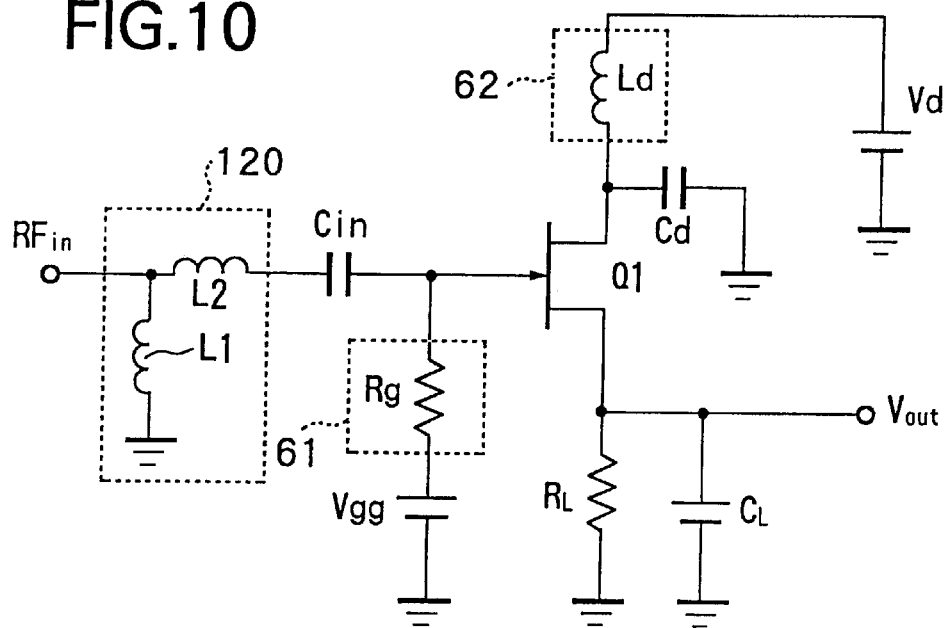
FIG. 10 is a circuit diagram of a fourth embodiment of the detection circuit according to the present invention.

FIG. 10 is a circuit diagram of a fourth embodiment of the high frequency power detection circuit according to the present invention. As illustrated, in the detection circuit of the present embodiment, a matching circuit 120 is provided between the input terminal RFin of the high frequency signal and the signal input use capacitor Cin. The other parts besides the matching circuit 120 are substantially the same as those of the first embodiment shown in FIG. 1. Here, the other parts or elements besides the matching circuit 120 are expressed by the same references as those in the first embodiment shown in FIG. 1. Below, the explanation will be made of the detection circuit of the present embodiment centering around the configuration and operation of the matching circuit 120.

The matching circuit 120 is provided to match the output impedance of a circuit generating a high frequency signal, for example, an intermediate frequency amplifier, with the input impedance of the high frequency power detection circuit. As one example, as shown in FIG. 10, it is constituted by inductors L1 and L2. Note that the matching circuit 120 is not limited to this example and may also be a circuit capable of matching the output impedance of for example an intermediate frequency amplifier before the detection circuit with the input impedance of the detection circuit. For example, it is also possible to use matching circuit constituted by inductors and capacitors besides just inductors.

Figure 11:
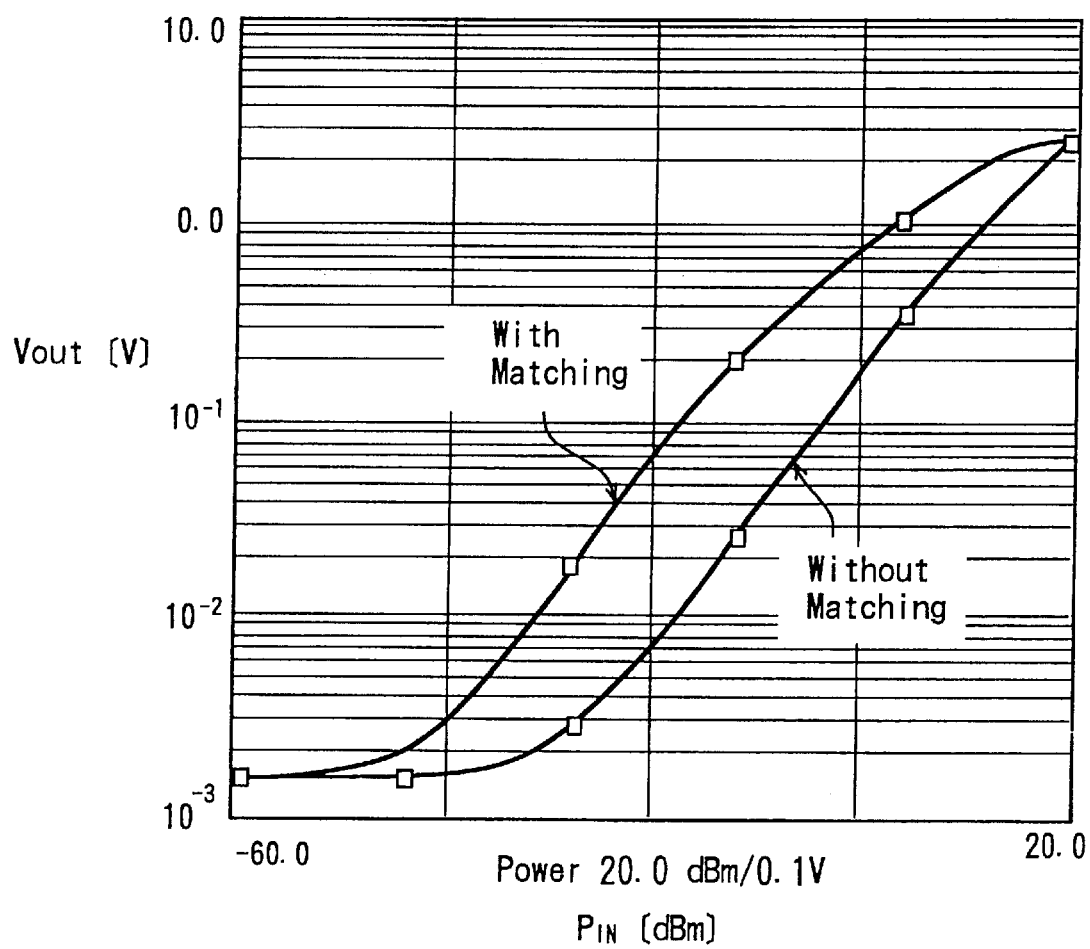
FIG. 11 is a graph showing improvement of the detection characteristic by matching circuit.
Figure 12:
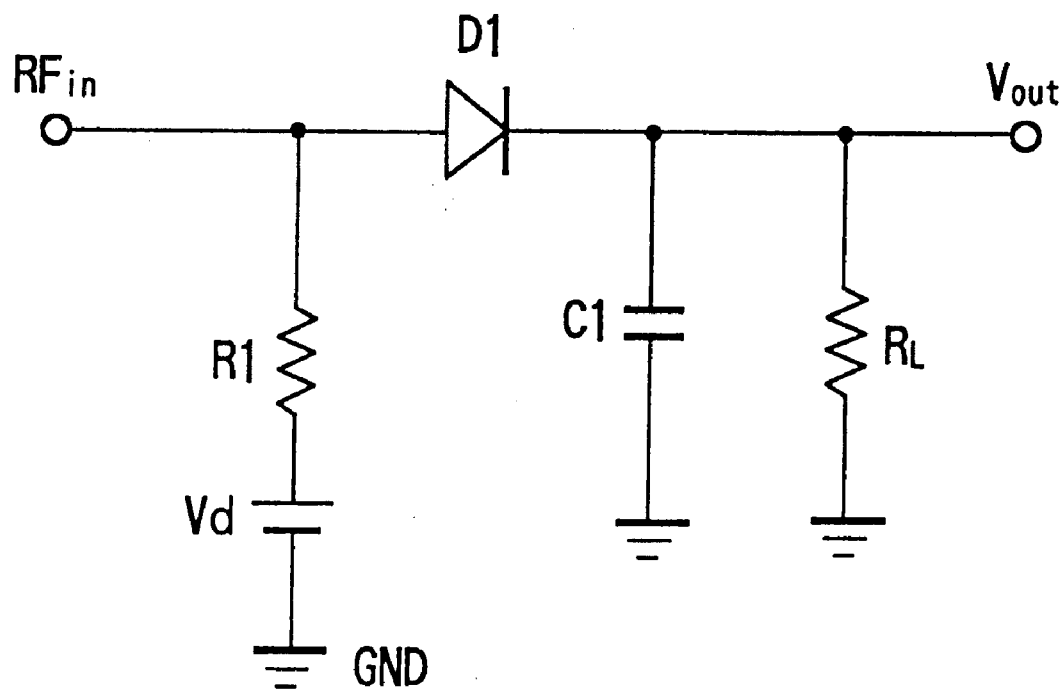
FIG. 12 is a circuit diagram of the configuration of a conventional high frequency detection circuit.
Figure 13:
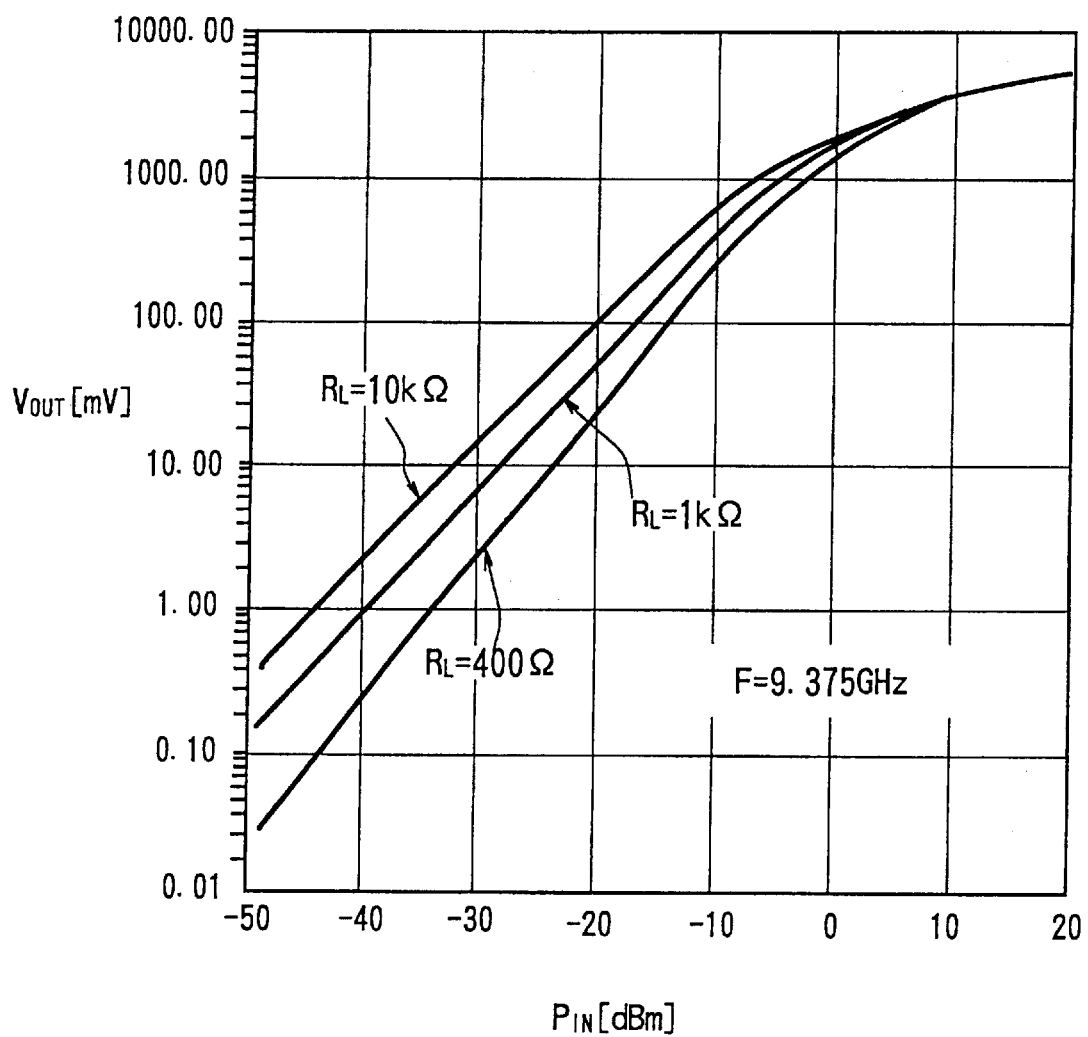
FIG. 13 is a graph showing a detection characteristic of the conventional detection circuit.

FIG. 11 is a graph showing a detection characteristic when a matching circuit 120 is provided at the input side of the detection circuit. Note that for comparison, a detection characteristic without provision of the matching circuit is also displayed.

As illustrated, in the case of providing a matching circuit 120, the detection output voltage becomes greater than that at a same power of the input high frequency signal without provision of the matching circuit. Namely, by providing the matching circuit, it is possible to detect a smaller power than the high frequency input signal and obtain a detection output based on this. Accordingly, the sensitivity of the detection circuit is improved and the input dynamic range is broadened.

In this way, according to the present embodiment, by connecting a matching circuit 120 to the input side of the detection circuit, it is possible to obtain a detection output for a signal having smaller power in the operational frequency band of the detection circuit and to realize an improvement of the sensitivity and the dynamic range of the detection circuit.

As explained above, according to the high frequency power detection circuit of the present invention, comparing with conventional detection circuits utilizing silicon Schottky diodes, since the detecting element, that is, the FET, can be formed on a semiconductor suited for high frequencies such as GaAs, the detection circuit is suited for monolithication. Accordingly, a small sized, low cost, broad band detection circuit suited for high frequency operation can be realized.

The detection circuit of the present invention is able to obtain a higher detection output voltage at a lower input power of a high frequency signal in comparison with a conventional detection circuit utilizing the GaAs diodes and enables realization of a high performance high frequency detection circuit.

Further, the detection circuit of the present invention makes use of the characteristic curve of the drain current Ids versus gate-to-source voltage Vgs of an FET. The Ids-Vgs characteristic of an FET is easier to adjust by changing the parameters of the process compared with a current versus voltage characteristic of a diode. It is possible to select process conditions of the FET to match the purpose of application of the detection circuit and to obtain a high performance detection circuit. For example, a detection circuit with a good linearity can be obtained by adjusting the process so that the Ids-Vgs characteristic of the FET becomes linear Further, since the gate bias voltage can be controlled automatically in accordance with variations in the pinchoff voltage by making use of the detection circuit of the present invention, there is the advantage that the effect of variations in the pinchoff voltage and so forth can be suppressed and an optimum detection characteristic can be obtained.

While the invention has been described with reference to specific embodiment chosen for purpose of illustration, it should be apparent that numerous modifications could be made thereto by those skilled in the art without departing from the basic concept and scope of the invention.

What is claimed is:

1. A detection circuit for detecting an envelope of an input signal having a predetermined frequency, comprising:
    a field effect transistor including a gate, a drain, and a source, to the gate of which the input signal is input through a coupling capacitor having a negligible impedance at said predetermined frequency,
    a gate bias circuit means for providing a gate bias voltage to the gate of the field effect transistor,
    a voltage source connected between an element in said gate bias circuit means and a source of reference potential,
    a coupling capacitor connected between the drain of the field effect transistor and the ground and having a negligible resistance at said predetermined frequency,
    a drain bias circuit means providing a drain bias to the drain of the field effect transistor,
    a second voltage source providing a voltage to an element of said drain bias circuit means, and
    a load capacitor and a load resistor connected in parallel between the source of the field effect transistor and the ground,
    wherein a detection signal corresponding to the envelope of the input signal is output from the source of the field effect transistor.

2. A detection circuit as set forth in claim 1, wherein the field effect transistor is a gallium-arsenide field effect transistor.

3. A detection circuit for detecting an envelope of an input signal having a selected frequency, comprising:
    a field effect transistor, including a gate, drain and source, to the gate of which the input signal is coupled,
    a gate bias circuit for providing a gate bias voltage to the gate of the field effect transistor,
    a capacitor connected between the drain of the field effect transistor and ground, and
    a load capacitor and a load resistor connected in parallel between the source of the field effect transistor and the ground, wherein a detection signal corresponding to the envelope of the input signal is output from the source of the field effect transistor, and wherein the gate bias circuit comprises:
- a first resistor connected to a power supply and
- a second resistor connected between the first resistor and the ground,
  wherein a divided voltage between the first and the second resistor is input to the gate of the field effect transistor as the gate bias voltage.

4. A detection circuit as set forth in claim 3, wherein any one of the first or the second resistor is a variable resistor, and the resistance of the variable resistor is controlled so that a gate bias voltage optimizing the detection performance of the field effect transistor is generated.

5. A detection circuit for detecting an envelope of an input signal having a selected frequency, comprising:
- a field effect transistor, including a gate, drain and source, to the gate of which the input signal is coupled,
- a gate bias circuit for providing a gate bias voltage to the gate of the field effect transistor,
- a capacitor connected between the drain of the field effect transistor and ground, and
- a load capacitor and a load resistor connected in parallel between the source of the field effect transistor and the ground,
- wherein a detection signal corresponding to the envelope of the input signal is output from the source of the field effect transistor, wherein the gate bias circuit comprises a gate bias voltage generating circuit for generating a gate bias voltage optimizing the detection performance of the field effect transistor based on the detection signal from the source of the field effect transistor and the gate bias voltage of the field effect transistor.

6. A detection circuit as set forth in claim 5, wherein the gate bias voltage generating circuit comprises:
- an analog-to-digital converter for converting the detection signal from the source of the field effect transistor to a digital signal,
- a processing circuit for calculating a gate bias voltage optimizing the detection performance of the field effect transistor based on the output signal of the analog-to-digital converter and the gate bias voltage of the field effect transistor, and
- a digital-to-analog converter for converting a digital signal indicating the result of the processing circuit to an analog signal.

7. A detection circuit as set forth in claim 6, further comprising a memory for storing data for calculating a digital signal optimizing the detection performance of the field effect transistor in accordance with the gate bias voltage and the detection signal from the source of the field effect transistor.

8. A detection circuit as set forth in claim 6, wherein the gate bias voltage generating circuit calculates an optimum gate bias voltage optimizing the detection performance of the field effect transistor in accordance with the detection signal from the source of the field effect transistor in the case of inputting a gate bias voltage of an initial value to the gate of the field effect transistor, then inputs the optimum gate bias voltage to the gate of the field effect transistor.

9. A detection circuit as set forth in claim 6, wherein the gate bias voltage generating circuit calculates an optimum gate bias voltage to optimize the detection performance of the field effect transistor in accordance with the detection signal obtained from the source of the field effect transistor in the case of inputting said input signal with a known power to the gate of the field effect transistor and supplies the optimum gate bias voltage to the gate of the field effect transistor.

10. A detection circuit as set forth in claim 1, wherein an impedance matching circuit for matching an output impedance of a signal source generating the input signal and a gate input impedance of the field effect transistor is connected to the gate of the field effect transistor.

11. A detection circuit as set forth in claim 1, wherein the gate bias circuit means comprises a gate bias voltage generating circuit for generating a gate bias voltage optimizing the detection performance of the field effect transistor based on the detection signal from the source of the field effect transistor.

12. A detection circuit for detecting an envelope of an input signal having a selected frequency, comprising:
- a field effect transistor, including a gate, drain and source, to the gate of which the input signal is coupled,
- a gate bias circuit for providing a gate bias voltage to the gate of the field effect transistor,
- a capacitor connected between the drain of the field effect transistor and ground, and
- a load capacitor and a load resistor connected in parallel between the source of the field effect transistor and the ground,
- wherein a detection signal corresponding to the envelope of the input signal is output from the source of the field effect transistor, and wherein the gate bias circuit comprises a gate bias voltage generating circuit for generating a gate bias voltage optimizing the detection performance of the field effect transistor based on the detection signal from the source of the field effect transistor; and
- wherein the gate bias voltage generating circuit further comprises:
  - an analog-to-digital converter for converting the detection signal from the source of the field effect transistor to a digital signal,
  - a processing circuit for calculating a gate bias voltage optimizing the detection performance of the field effect transistor based on the output signal of the analog-to-digital converter, and
  - a digital-to-analog converter for converting a digital signal indicating the result of the processing circuit to an analog signal.

13. A detection circuit as set forth in claim 12, further comprising a memory for storing data for calculating a digital signal optimizing the detection performance of the field effect transistor in accordance with the detection signal from the source of the field effect transistor.

14. A detection circuit for detecting an envelope of an input signal, comprising:
- a field effect transistor having a gate, source and drain, and to the gate of which the input signal is coupled through an input capacitor,
- means for providing a gate bias voltage to the gate of the field effect transistor,
- a drain capacitor connected between the drain of the field effect transistor and the ground, and
- a load capacitor and a load resistor connected in parallel between the source of the field effect transistor and the ground,
- wherein a detection signal corresponding to the envelope of the input signal is output from the source of the field effect transistor, and wherein each of said input, drain and load capacitors is sized to present a negligible impedance at the frequency of said input signal.

15. A detection circuit as set forth in claim 1, wherein the field effect transistor is a gallium-arsenide field effect transistor.

16. A detection circuit as set fourth in claim 14, wherein the means for providing a gate bias circuit includes a means for generating a gate bias voltage optimizing the detection performance of the field effect transistor based on the detection signal from the source of the field effect transistor and the gate bias voltage of the field effect transistor.

17. A detection circuit as set fourth in claim 16, wherein means for providing the gate bias voltage comprises:

an analog-to-digital converter for converting the detection signal from the source of the field effect transistor to a digital signal, a processing circuit for calculating a gate bias voltage optimizing the detection performance of the field effect transistor based on the detection performance of the field effect transistor based on the output signal of the analog-to-digital converter and the gate bias voltage of the field effect transistor, and a digital-to-analog converter for converting a digital signal indicating the result of the processing circuit to an analog signal.

18. A detection circuit as set forth in claim 17, further comprising a memory for storing data for calculating a digital signal optimizing the detection performance of the field effect transistor in accordance with the gate bias voltage and the detection signal from the source of the field effect transistor.

19. A detection circuit as set forth in claim 17, wherein the means for providing the gate bias voltage calculates an optimum gate bias voltage optimizing the detection performance of the filed effect transistor in accordance with the detection signal from the source of the field effect transistor in the case of inputting a gate bias voltage of an initial value to the gate of the field effect transistor, then inputs the optimum gate bias voltage to the gate of the field effect transistor.

20. A detection circuit as set forth in claim 19, wherein an impedance matching circuit for matching an output impedance of a signal source generating the high frequency input signal and a gate input impedance of the field effect transistor is connected to the gate of the field effect transistor.

* * * * *